United States Patent
Fan et al.

(10) Patent No.: US 9,333,531 B2
(45) Date of Patent: May 10, 2016

(54) OPTO-ELECTRIC DEVICE AND METHOD FOR MANUFACTURING THE SAME

(75) Inventors: Chia-Chen Fan, The Hague (NL);
Joanne Sarah Wilson, Dordrecht (NL);
Antonius Maria Bernardus Van Mol, Eindhoven (NL); Stephan Harkema, Eindhoven (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 239 days.

(21) Appl. No.: 13/389,058

(22) PCT Filed: Aug. 6, 2010

(86) PCT No.: PCT/NL2010/050498
§ 371 (c)(1),
(2), (4) Date: Aug. 16, 2012

(87) PCT Pub. No.: WO2011/016724
PCT Pub. Date: Feb. 10, 2011

(65) Prior Publication Data
US 2013/0075777 A1  Mar. 28, 2013

(30) Foreign Application Priority Data
Aug. 6, 2009 (EP) ..................... 09167416

(51) Int. Cl.
*B05D 5/12* (2006.01)
*H01L 33/62* (2010.01)
(Continued)

(52) U.S. Cl.
CPC ............... *B05D 5/12* (2013.01); *G02F 1/1533* (2013.01); *H01L 31/0216* (2013.01);
(Continued)

(58) Field of Classification Search
CPC ..... B05D 5/12; G02F 1/1533; H01L 31/0216; H01L 33/62; H01L 51/0096; H01L 51/102; H01L 51/5203
USPC ....... 257/40, 79, 98, 99, E51.022; 438/29, 31
See application file for complete search history.

(56) References Cited

U.S. PATENT DOCUMENTS 7,749,794 B2   7/2010   Gaudiana et al.
7,815,983 B2   10/2010  Iwanaga
(Continued)

FOREIGN PATENT DOCUMENTS

CN    1300520 A    6/2001
CN    101263588 A  9/2008
(Continued)

OTHER PUBLICATIONS

International Search Report, PCT/NL2010/050498, Date of mailing: Nov. 10, 2010.

*Primary Examiner* — Jose R Diaz
(74) *Attorney, Agent, or Firm* — Banner & Witcoff, Ltd.

(57) ABSTRACT

A thin-film optoelectric device is disclosed comprising a functional layer structure (30) enclosed between a first barrier layer structure (20) and a second barrier layer structure (40), the device having an open, electrically interconnected conductive structure (10) that is embedded within the first barrier layer structure (20), that comprises at least one elongated element (12a, 12b, 12c) of a metal that laterally extends within the barrier layer structure (20), and that is arranged against the functional layer structure (30), the electrically interconnected conductive structure (10) having a laterally facing, processed surface embedded in the first barrier layer (20).

8 Claims, 6 Drawing Sheets

(51) Int. Cl.
*H01L 51/00* (2006.01)
*H01L 51/10* (2006.01)
*H01L 51/52* (2006.01)
*G02F 1/153* (2006.01)
*H01L 31/0216* (2014.01)

(52) U.S. Cl.
CPC ........... *H01L 33/62* (2013.01); *H01L 51/0096* (2013.01); *H01L 51/102* (2013.01); *H01L 51/5203* (2013.01); *H01L 51/5237* (2013.01); *H01L 2924/0002* (2013.01); *Y02E 10/549* (2013.01); *Y02P 70/521* (2015.11)

(56) References Cited

U.S. PATENT DOCUMENTS

| | | | |
|---|---|---|---|
| 7,932,106 B2 * | 4/2011 | Li | 438/22 |
| 8,614,698 B2 * | 12/2013 | Desieres et al. | 345/204 |
| 2001/0015620 A1 | 8/2001 | Affinito | |
| 2002/0172832 A1 | 11/2002 | Nagano et al. | |
| 2003/0127973 A1 | 7/2003 | Weaver et al. | |
| 2003/0160243 A1 | 8/2003 | Middelman et al. | |
| 2005/0158917 A1 | 7/2005 | Kimura | |
| 2006/0160243 A1 | 7/2006 | Tang et al. | |
| 2009/0160320 A1 * | 6/2009 | Borner et al. | 313/504 |
| 2009/0309126 A1 * | 12/2009 | Okuno | 257/103 |
| 2012/0276734 A1 * | 11/2012 | van Mol et al. | 438/618 |

FOREIGN PATENT DOCUMENTS

| | | |
|---|---|---|
| EP | 1100291 A1 | 5/2001 |
| JP | 2001036200 A | 2/2001 |
| JP | 2003178876 A | 6/2003 |
| JP | 2003308026 A | 10/2003 |
| JP | 2004014295 | 1/2004 |
| JP | 2004258364 A | 9/2004 |
| JP | 2005324406 A | 11/2005 |
| JP | 2006236626 | 9/2006 |
| JP | 2007253590 A | 10/2007 |
| JP | 2009146640 A | 7/2009 |
| JP | 2009203356 A | 9/2009 |
| WO | 03/094256 | 11/2003 |
| WO | 2005/096405 | 10/2005 |
| WO | 2007/036850 | 4/2007 |
| WO | 2007/041116 | 4/2007 |
| WO | 2007/070778 | 6/2007 |
| WO | 2008/061988 A1 | 5/2008 |
| WO | WO 2008061988 A1 * | 5/2008 |
| WO | 2008/139934 | 11/2008 |

* cited by examiner

OPTO-ELECTRIC DEVICE AND METHOD FOR MANUFACTURING THE SAME

CROSS-REFERENCE TO RELATED APPLICATIONS

This application is a U.S. National Stage application under 35 U.S.C. §371 of International Application PCT/NL2010/050498 (published as WO 2011/016724 A1), filed Aug. 6, 2010, which claims priority to Application EP 09167416.8, filed Aug. 6, 2009. Benefit of the filing date of each of these prior applications is hereby claimed. Each of these prior applications is hereby incorporated by reference in its entirety.

BACKGROUND

1. Field of the Invention

The present invention relates to an opto-electric device.

The present invention further relates to a method for manufacturing an opto-electric device.

The present invention further relates to a semi-finished product that can be used in the method.

The present invention still further relates to a method of manufacturing the semi-finished product.

2. Related Art

An optoelectric device is a device that provides for an optical effect in response to an electric signal, or that generates an electric signal in response to an optical stimulus. Examples of the first are light emitting diodes, such as organic light emitting diodes and electro chromic devices. Examples of the second are photo voltaic cells.

For large area OLED lighting on flexible plastic substrates, a large current is required to drive the system. The present thin film materials used for the anode (e.g. ITO) and cathode (e.g. Ba/Al) have a large resistivity and the large currents give rise to substantial voltage drop, which determine a non-uniform light emission. For producing large area flexible OLED devices on plastic substrates there is a need for an additional metallization structure of the plastic substrate. For reducing the manufacturing costs, such structured metallization coatings will preferably be applied on rolls of plastic foil using an inline roll-to-roll web coating process.

Accordingly, for optoelectric devices, such as light emitting devices and electro-chromic devices, but also for photovoltaic products there is a need for a metallization structure that on the one hand has a good electrical conductivity, while on the other hand has a high transmission for photon radiation.

WO2007/036850 describes an organic diode device that comprises an organic diode structure having an anode layer, a cathode layer and an organic layer. One of the anode layer and the cathode layer has a set of contact areas that are distributed over a face of said structure. A barrier layer hermetically covers said structure and is provided with a set of openings aligned with said set of contact areas. A metal conductor has been electroplated on said barrier layer and contacts the set of contact areas via the set of openings.

The electroplated metal conductor shunts the anode and the cathode, and therewith provides for an even voltage distribution over the area of a large organic diode device and therewith an even luminance.

SUMMARY

It is an object of the invention to provide an improved optoelectric device. It is a further object of the invention to provide an improved method for manufacturing an optoelectric device.

It is a still further object of the invention to provide a semi-finished product that can be used in the method.

It is a still further object of the present invention to provide a method of manufacturing the semi-finished product.

According to a first aspect of the present invention a method of manufacturing a thin-film optoelectric device is provided comprising the steps of     providing (S1) a first, metal substrate,     patterning (S2) a first main surface of the metal substrate, therewith creating protruding and recessed portions in said first main surface,     depositing (S3) a first barrier layer structure at the first main surface of the metal substrate,     removing (S4) material from the metal substrate at a second main surface opposite the first main surface, therewith revealing the first barrier layer structure opposite the recessed portions,     applying (S5) a functional structure at a side of the first barrier layer structure where the material from the metal substrate was removed,     applying (S6) a second barrier layer structure.

Contrary to the known method the electrically conductive structure is at least partially prepared before the barrier structure is applied. Namely, as a preparatory step a surface pattern having protruding and recessed portions is created at a first main surface of the metal substrate. By carrying out this preparatory step the protruding and the recessed portions can have a relatively large height difference in comparison to the distance between the protruding portions. The recessed portions are created by selective removal of material from the first main surface. Removal may take place by a chemical process, e.g. by etching the material away, but may alternatively take place by a mechanical process, e.g. by imprinting, so that material is pressed away from the first main surface.

By starting with a metal substrate high temperature processing steps, such as high temperature deposition of a barrier structure, are applicable until the point in time that organic materials are applied.

After the subsequent steps of applying the barrier layer structure and the removing of material from the metal substrate at a second main surface opposite the first main surface an electrically conductive structure results comprising mutually connected elongated elements that extend laterally in the barrier layer structure and that can have a relatively large height to width ratio. The barrier layer structure having embedded therein the electrically conductive structure forms a substantially flat surface (apart from a certain roughness caused by the removal process, such as etching). This facilitates the application of the functional layer structure as compared to a surface formed by an electrically conductive structure that is applied upon the barrier layer structure.

Although optionally a transparent electrode layer may be applied at the barrier layer structure with the electrically conductive structure embedded therein, this is not necessary. This is advantageous, as materials that are usually applied for such a layer, such as tin oxide or indium tin oxide are relatively expensive, and are difficult to process due to the fact that they are brittle. It is sufficient that a high conductivity polymer layer such as PEDOT is applied to provide for a current distribution in the areas left open by the electrically conductive structure.

In practical embodiments the mutually connected elongated elements may have a width and a height in the range of a few μm to a few tens of μm and a length in the range of few μm to a few cm.

The thin-film device is locally planar but may be curved in arbitrary shape on a more global scale. In practice a flat thin film device having a thickness D may be curved up to a radius of 50 times the thickness D. Alternatively the thin-film device according to the present invention may be manufactured in an initially curved shape. On the local scale the plane of the barrier layer structure defines lateral dimensions. The height of the structure is defined transverse to the plane.

When removing material from the metal substrate at the second main surface the removing process is preferably stopped at the moment that the barrier layer structure is revealed at the location of the recessed portions. If the process is continued longer then the remaining electrically conductive structure will be deepened with respect to the barrier layer structure, while it is preferred that the level of the surface of the remaining electrically conductive structure coincides with the level of the surface of the barrier layer structure. If desired an additional layer of a conducting material may be applied at the electrically conductive structure to equalize the level.

In an embodiment of the method a metal substrate is used that comprises a first and a second metal layer that are separated by an etch stop layer. The etch stop layer is removed after the step S4 of removing material from the metal substrate at the second main surface and before the step S5 of applying the functional structure.

This has the advantage that in the step S2 of patterning the first main surface, a well defined height difference is obtained between the recessed and the protruding portions. Moreover, in the step S4 of removing material from the second main surface of the metal substrate it is achieved that the etch process will automatically be interrupted at the right moment.

According to a second aspect of the invention a thin-film optoelectric device is provided that comprises
 a functional layer structure enclosed between a first barrier layer structure and a second barrier layer structure,
 the device having an open, electrically interconnected conductive structure that is embedded within the first barrier layer structure, that comprises at least one elongated element of a metal that laterally extends within the barrier layer structure, and that is arranged against the functional layer structure, the electrically interconnected conductive structure having a laterally facing, processed surface embedded in the first barrier layer.

According to the method of the present invention the electrically conductive structure of a thin-film optoelectric device results from a metal substrate that was prepared by removing material from the first surface before applying the barrier layer at said first surface. Hence a thin-film optoelectric device according to the present invention can be recognized in that the electrically conductive structure has a processed surface within the barrier layer. It will be recognized that the surface within the barrier layer is processed by etching or by imprinting for example. Also the surface of the electrically conductive structure facing away from the first barrier layer structure will be processed. Surfaces facing away from and surfaces within the first barrier layer need not be processed in the same way. For example the surfaces within the first barrier layer may be defined by an imprinting method, while the surfaces facing away from the barrier layer are defined by an etching method.

According to a first example, the electrically conductive structure comprises a plurality of parallel lines having a width W, height H and a length L and a distance D. The conductivity of the structure is proportional to H·W/D. The transmissivity is proportional to (D−W)/D. According to a second example the electrically conductive structure comprises a maze structure, having rectangular openings. In that case the conductivity is proportional to $H \cdot ((D-W)/D)^2$.

It is sufficient that the opto electric device is transparent at the side of the first barrier layer. In this way, in a LED device, light can escape from the functional structure via the open electrically conductive structure to outside the device. Accordingly the electrode on the other side of the functional structure does not have to be transparent, and hence can be relatively thick and therewith have a good electrical conductivity. The same applies to a photo-voltaic element. It is sufficient if light from the environment can reach the functional structure via the electrically conductive structure.

BRIEF DESCRIPTION OF THE DRAWINGS

These and other aspects are described in more detail with reference to the drawing. Therein FIG. 2A to 2J illustrate a first embodiment of a method according to the present invention, more in particular, FIG. 3A to 3H illustrate a second embodiment of a method according to the present invention, more in particular.

DETAILED DESCRIPTION OF EMBODIMENTS

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures.

It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

Figure 1:
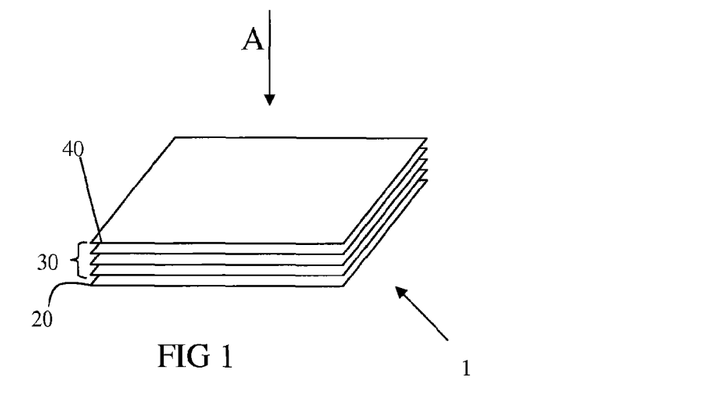
FIG. 1 shows a general structure of a thin-film opto-electric device.

FIG. 1 schematically shows a thin-film opto-electric device 1. The device comprises a functional layer structure 30 that may comprise a plurality of functional layers and that is arranged between a first barrier layer structure 20 and a second barrier layer structure 40.

Figure 2A:
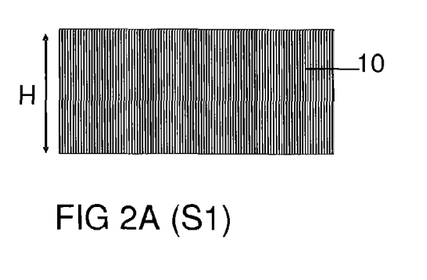
FIG. 2A shows a first step S1 of the method according to this first embodiment.
Figure 2B:
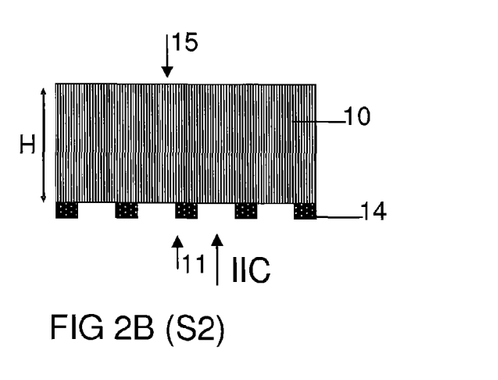
FIG. 2B shows a first aspect of a second step S2 of the method according to this first embodiment.
Figure 2C:
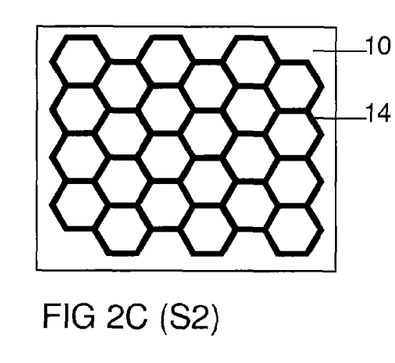
FIG. 2C shows a second aspect of the second step S2.
Figure 2D:
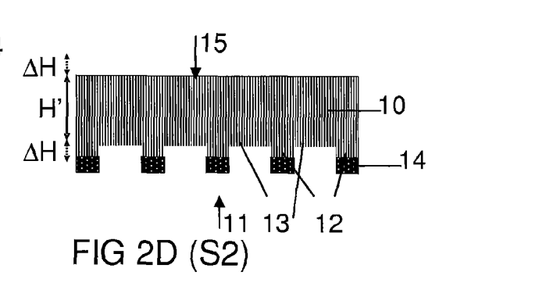
FIG. 2D shows a third aspect of the second step S2.
Figures 2E, 2F:
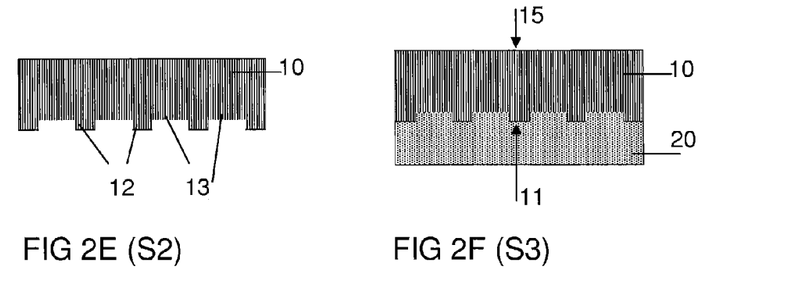
FIG. 2E shows a fourth aspect of the second step S2.
FIG. 2F shows a third step S3 of the method according to this first embodiment.
Figures 2G, 2H, 2I, 2J:
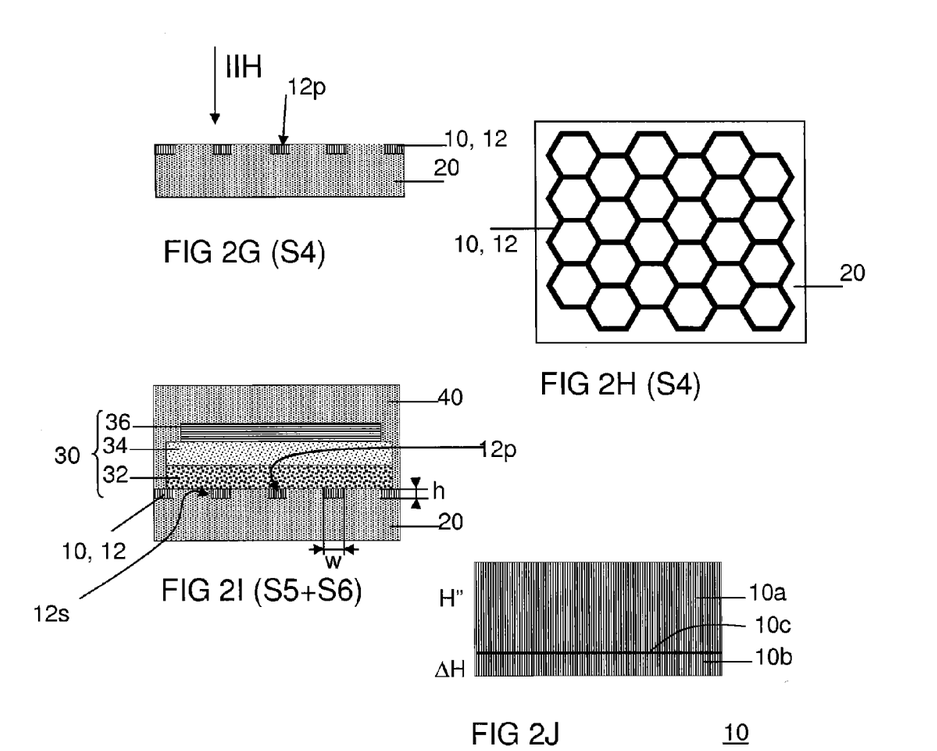
FIG. 2G shows a fourth step S4 of the method according to this first embodiment.
FIG. 2H shows a view according to IIH in FIG. 2G.
FIG. 2I shows a first embodiment of a thin-film opto-electric device according to the invention obtained after completion of the method according to this first embodiment.
FIG. 2J shows an advantageous material for use in the present method.

FIGS. 2A to 2I schematically show a method according the present invention to manufacture a thin-film opto-electric device according to the invention as shown in FIG. 2I.

As illustrated in FIG. 2A the method according to the present invention comprises a first step S1 of providing a first, metal substrate. The metal substrate comprises for example a metal like aluminum, titanium, copper, steel, iron, nickel, silver, zinc, molybdenum, chromium or alloys thereof. In the embodiment shown the metal substrate has a height H that is chosen in the range of 50 to 500 μm, here 100 μm. If the height H is substantially smaller than 50 μm, e.g. 25 μm, the metal substrate will be relatively fragile, and therewith difficult to handle in an industrial process. If the height H is substantially greater than 500 μm, e.g. 1 mm, the metal substrate will be relatively stiff and therewith also difficult to handle in an industrial process using roll to roll methods. Moreover, a relatively long process time is necessary in step S4 described below.

In a second step S2 a first main surface 11 of the metal substrate is patterned. In the embodiment shown step S2 comprises a first substep wherein a patterned protection layer 14 is applied on the first main surface 11, as is shown in FIG. 2B. The patterned protection layer 14 may be a photo resist layer that is applied and patterned by conventional photolithographic technologies. FIG. 2C shows a view according to IIC in FIG. 2B illustrating an example wherein the protection layer 14 is patterned in the form of a hexagonal maze. In a second substep, shown in FIG. 2D, the metal substrate 10 provided with the patterned protection layer 14 is etched. Etching of the metal substrate layer 10 could be achieved using an acid or a base such as nitric acid, sulphuric acid, sodium hydroxide (NaOH) or potassium hydroxide. As the metal substrate 10 is covered by the patterned protection layer 14 at its first side 15, the etching process results in a pattern of protruding portions 12 that is conformal with the pattern of the protection layer 14 and that has recessed portions 13 there between. In the embodiment shown the recessed portions are etched until a depth ΔH of about 10 μm. As the metal substrate is carried through an etch bath it is also etched at its second side with said depth ΔH of about 10 μm. This is not a problem as the metal substrate 10 will be etched anyhow at this side in a fourth step S4 described later. In case a very thin metal substrate is used and it is undesirable that the metal substrate 10 is also etched at the second side 15, other etching methods may be used. For example the etching agent may be selectively applied by a roller at the first side. After the etching process is finished, the patterned protection layer 14 is removed to obtain the semi-finished product of FIG. 2E. This semi-finished product is a metal substrate 10 having a thickness H' and a relief thereon with a thickness ΔH. When etching the metal substrate in step S2 a particular surface pattern may be created in the remaining second main surface 15 of the metal substrate 10, in order to improve the light output in an OLED for example.

Instead of creating the structure of protruding portions 12 and recessed portions 13 in the first main surface 11 of the metal substrate 10 by the patterned etching process illustrated with reference to FIGS. 2B to 2E, the structure may alternatively be applied by imprinting the first main surface 11 with a stamp.

Figure 7:
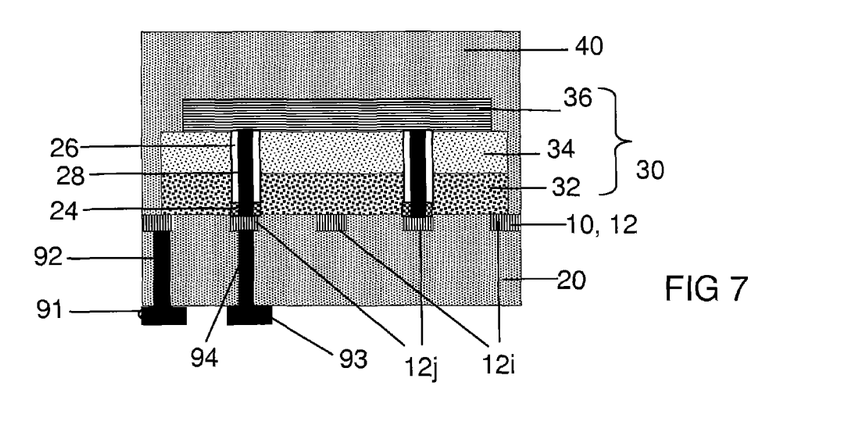
FIG. 7 shows a fourth embodiment of a thin-film opto-electric device according to the invention.

It is noted that a patterned photo resist layer may also be used to form insulating regions onto the substrate with the electrically conductive structure embedded therein, e.g. as described with respect to FIG. 7 below.

After the structure of protruding portions 12 and recessed portions 13 has been formed in step S2, a first barrier layer structure 20 is deposited at the first main surface 11 of the metal substrate 10. Although the first barrier layer structure 20 is shown for clarity as a single layer it may in practice comprise a plurality of layers, e.g. a stack of alternating inorganic and organic layers, for example a stack comprising an organic layer sandwiched between a first and a second inorganic layer. The inorganic layers are for example of a ceramic material, including but not limited to metal oxide, such as silicon nitride (SiN), silicon oxide, and aluminum oxide. The one or more organic layers are for example provided from a cross-linked (thermoset) material, an elastomer, a linear polymer, or a branched or hyper-branched polymer system or any combination of the aforementioned, optionally filled with inorganic particles of a size small enough to still guarantee light transmission. The material is processed either from solution or as a 100% solids material. Curing or drying may exemplary occur by irradiation of the wet material, pure, or suitably formulated with a photo- or heat-sensitive radical or super-acid initiator, with UV-light, visible light, infrared light or heat, E-beam, g-rays or any combination of the aforementioned. The material of the organic layer preferably has a low specific water vapour transmission rate and a high hydrophobicity. Examples of suitable cross-linking (thermoset) systems are any single one or any combination of aliphatic or aromatic epoxy acrylates, urethane acrylates, polyester acrylates, polyether acrylates, saturated hydrocarbon acrylates, epoxides, epoxide-amine systems, epoxide-carboxylic acid combinations, oxetanes, vinyl ethers, vinyl derivatives, and thiol-ene systems. Suitable examples of elastomeric materials are polysiloxanes. Examples of suitable branched or linear polymeric systems are any single one or any copolymer or physical combination of polyacrylates, polyesters, polyethers, polypropylenes, polyethylenes, polybutadienes, polynorbornene, cyclic olefin copolymers, polyvinylidenefluoride, polyvinylidenechloride, polyvinylchloride, polytetrafluoroethylene, polychlorotrifluoroethylene, polyhexafluoropropylene. The organic layers may have a thickness between 0.1-100 μm, preferably between 5 and 50 μm. The inorganic layer(s) are in practice substantially thinner than the organic layers. The inorganic layers should have a thickness in the range of 10 to 1000 nm, preferably in the range of 100 to 300 nm Inorganic layers forming the first barrier structure may be applied by all kinds of physical vapour deposition methods such as thermal evaporation, e-beam evaporation, sputtering, magnetron sputtering, reactive sputtering, reactive evaporation, etc. and all kinds of chemical vapour deposition methods such as thermal chemical vapour deposition (CVD), photo assisted chemical vapour deposition (PACVD), plasma enhanced chemical vapour deposition (PECVD), etc. Organic layers may be applied by all kinds of coatings techniques, such spin coating, slot-die coating, kiss-coating, hotmelt coating, spray coating, etc. and all kinds of printing techniques, such as inkjet printing, gravure printing, flexographic printing, screen printing, rotary screen printing, etc.

A particular good barrier is formed by a stack of alternating layers of silicon oxide (O) and silicon nitride (N). The structure may be finished with an organic layer as indicated above. The barrier layer structure 20 may serve as a substrate during further processing steps and in the final product.

After the barrier layer structure 20 is applied in step S3, material is removed from the second main surface 15 of the metal substrate 10, opposite the first main surface 11 in a fourth step S4, e.g. with an etching agent such as NaOH. Therewith the bulk of the metal substrate 10 is removed including its recessed portions 13. Only the protruding portions 12 remain. Therewith the first barrier layer structure 20 opposite the recessed portions 13 is revealed. The protruding portions 12 remaining in the barrier layer structure 20 form an open, electrically interconnected conductive structure 12. A view thereof according to IIH is shown in FIG. 2H.

If in step S4 the metal substrate is etched too far, then the electrically interconnected conductive structure 12 may be completed by depositing an additional conductive material (for example by screen printing or electroplating a metal ink in these regions).

Alternatively, or in addition it is possible to provide the metal substrate in the form of a first and a second metal layer 10a, 10b that are separated by an etch stop layer 10c, as is shown in FIG. 2J. For example the metal substrate comprises a first copper layer 10a having a thickness H" of 90 μm, a gold layer 105b having a thickness of 2 μm and a second copper layer 10b having a thickness ΔH of 10 μm. The etch stop layer 10c, e.g. a layer of TiN, may be removed after the step S4 of removing material from the metal substrate at the second main surface and before further layers are applied at the electrically conductive structure 10.

After the completion of step S4, possibly including the additional deposition of a conductive material, a functional structure 30 is applied at the surface defined by the first barrier layer structure 20 with the electrically interconnected conductive structure 12, i.e. at a side of the first barrier layer structure 20 where the material from the metal substrate 10 was removed.

The nature of the functional structure 30 depends on the type of electro-optic device that is desired. In the embodiment shown the electro-optic device is a LED device. The electro-optic device in this case comprises a light emitting layer 34, for example such as polymeric PPV or layer stacks and mixtures of small molecules possibly including phosphorescent emitters such as $Ir(ppy)_3$. In the embodiment shown further a hole injection layer (HIL) 32 such as PEDOT is present. More layers may be present, such as a hole transport layer, an electron block layer, an electron transport layer. The hole transport layer 32 provides for a uniform distribution of the current between the mazes formed by the electrically conductive structure 12. The electrically conductive structure 12 forms a first electrode layer, here an anode. A second electrode layer, here a cathode 36 is applied. The cathode layer 36 is for example formed as a dual layer of Ba/Al, comprising a first layer of barium having a thickness of 5 nm in contact with the functional structure 30 and a second layer of Al having a thickness of 100 nm upon the Ba layer. Other suitable materials are for example LiF or Ag.

The second electrode layer 36 may be applied by a number of different techniques including thermal evaporation, printing and coating techniques, lamination of a metal layer or the use of ionic liquids.

A second barrier layer structure 40 is then applied to encapsulate the stack 32-36 and therewith protect the device from damage by moisture and the like. The second barrier layer structure 40 may be deposited in the same way and with similar methods as the first barrier layer structure 20.

Therewith a thin-film electro-optic device is obtained as shown in FIG. 2I. In this device the active layer structure 30 is centrally arranged within the encapsulating package formed by the first and the second barrier layer structure 20, 40. This is favorable for the mechanical stability of the device for example upon flexing thereof.

In order to facilitate a long life-time of the product also in the presence of moisture the encapsulating package 20, 40 has a water vapour transmission rate of at most $10^{-4}$ g·m$^{-2}$·day$^{-1}$. An organic or organo-silicon layer which is enclosed by inorganic layers in the first and/or the second barrier layer structure 20, 40 may contain getter material or getter particles such as CaO.

The thin-film optoelectric device so obtained comprises a functional layer structure 30 that is arranged between a first barrier layer structure 20 and a second barrier layer structure 40.

Figure 4A:
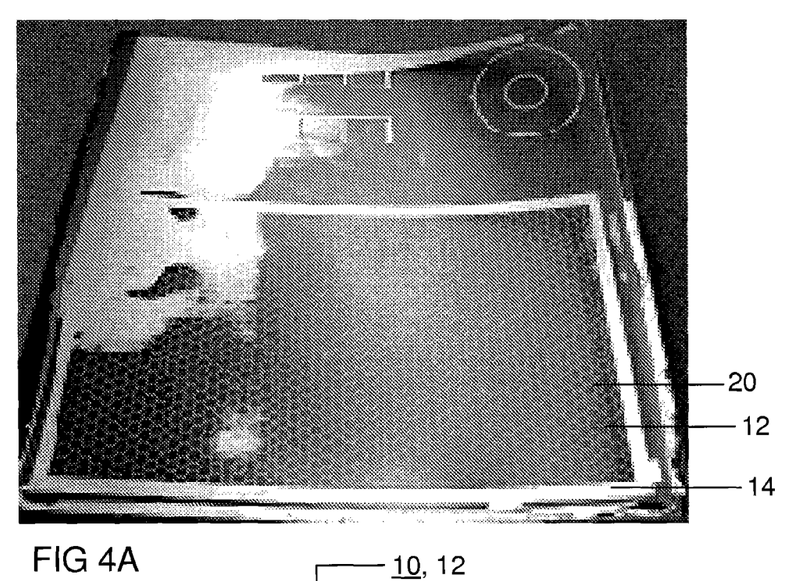
FIG. 4A is a photograph showing an overview of the product of FIG. 3G.

The first electrode layer 12 is embedded in the first barrier layer structure 20 and is formed by an open, electrically interconnected conductive structure 12. The structure comprises at least one elongated element 12a of a metal that laterally extends within the barrier layer structure 20. The open, electrically interconnected conductive structure 12 is arranged against the functional layer structure 30. In the embodiment of FIG. 2I the open, electrically interconnected conductive structure 12 is formed as a hexagonal maze. FIG. 4A shows in a photograph with an overview of the device, here having a size of 15×15 cm. The portion shown therein comprises mutually interconnected elongated elements 12a, 12b, 12c having a width w and a height h. In this embodiment the width w is approximately 90 micrometer. The height h is 12 to 16 micrometer. The elements have a length of approximately 3 mm. The hexagonal maze 12 is at its circumference electrically connected to a conducting frame 14. The frame 14 may comprise of metal supply conductors wider than the elongated elements 12a, 12b, 12c, e.g. have a width in the range of 1 to 5 mm, for example 1 mm to facilitate an electrical contact with the electrically interconnected conductive structure 12.

Figure 3A:
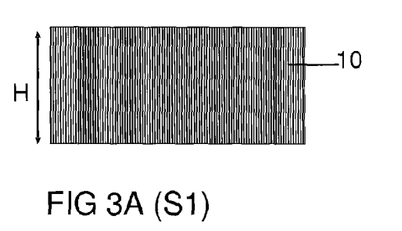
FIG. 3A shows a first step S1 of the method according to this second embodiment.
Figure 3B:
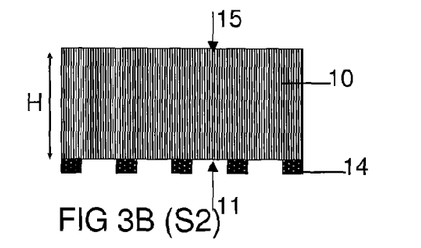
FIG. 3B shows a first aspect of a second step S2 of the method according to this first embodiment.
Figure 3C:
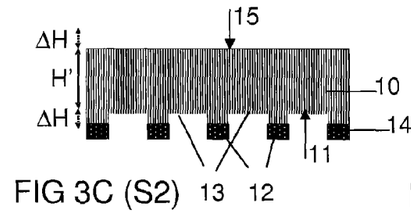
FIG. 3C shows a second aspect of the second step S2.
Figure 3D:
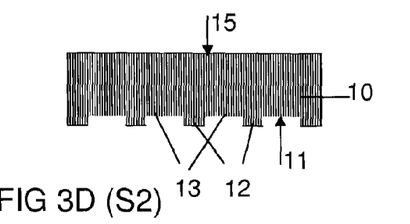
FIG. 3D shows a third aspect of the second step S2.
Figure 3E:
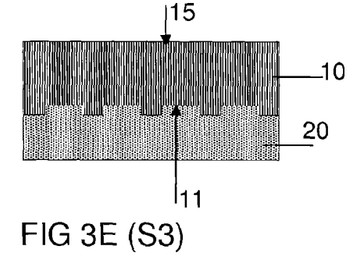
FIG. 3E shows a third step S3 of the method according to this second embodiment.
Figure 3F:
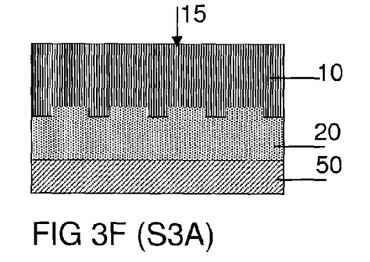
FIG. 3F shows an additional step of the method according to this second embodiment.
Figures 3G, 3H:
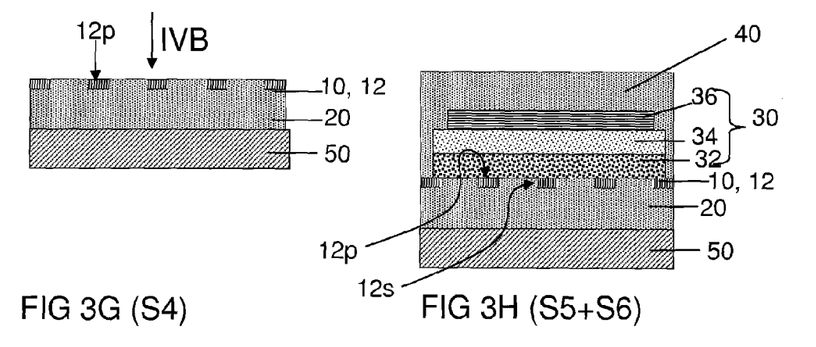
FIG. 3G shows a fourth step S4 of the method according to this second embodiment.
FIG. 3H shows a second embodiment of the thin-film opto-electric device according to the invention obtained after completion of the method according to this second embodiment.
Figure 4B:
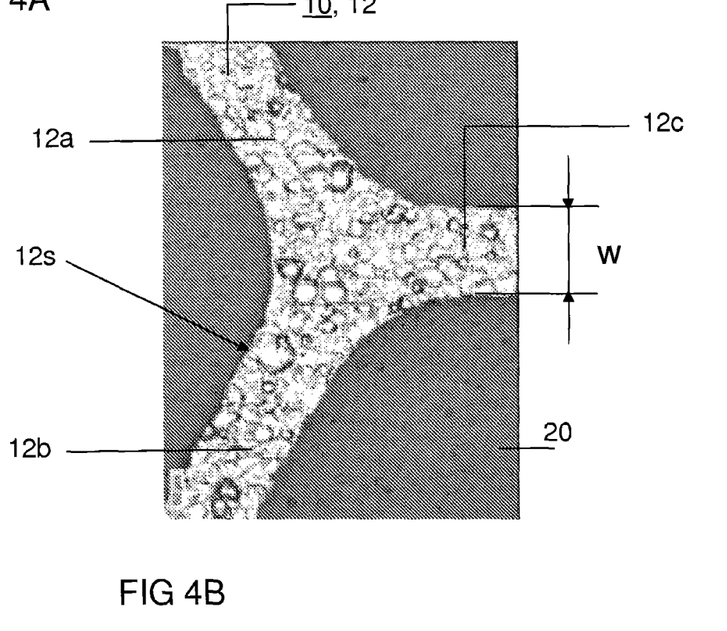
FIG. 4B is a micro photograph showing a detail according to IVB in FIG. 3G.

In the embodiment shown the frame 14 was formed from the metal substrate 10 in the same process wherein the hexagonal maze 12 was formed. Alternatively, a frame 14 may be formed by an alternative process. In the micro photograph of FIG. 4B, showing according to IVB a portion of the surface of the semifinished product in FIG. 3G, it is visible that the electrically interconnected conductive structure 12, has a processed surface. This processed surface will form the processed surface 12p facing the functional layer structure (30) as indicated in FIG. 2I. Here the surface 12p, is processed by etching. This can be recognized by the skilled person in the bubbly surface of the electrically interconnected conductive structure 12. In particular the etched surface has bubbles with a size in the range of a few to a few tens of micrometers. Likewise the elongated elements of the electrically interconnected conductive structure 12, have such a processed surface 12s embedded in the barrier layer 20 and facing laterally. Alternatively the laterally facing surfaces 12s of the elongated elements could have been obtained by imprinting.

FIGS. 3A to 3H show a second embodiment of a method according to the invention. The method shown differs from the embodiment shown in FIG. 2A to 2I in that in an additional step S3A, shown in FIG. 3F a substrate 50 of an organic material is applied at a free surface of the barrier structure 20 before removing material from the second main surface 15 of the metal substrate 10. The substrate 50 may be an organic layer of the same type as described above for use in the barrier structure 20 described in connection with the first embodiment of the method in FIG. 2F. The barrier structure 20 in this embodiment is for example a stack of layers of a first inorganic material (e.g. of silicon oxide) and a second inorganic material (e.g. silicon nitride) that alternate each other.

Figure 5A:
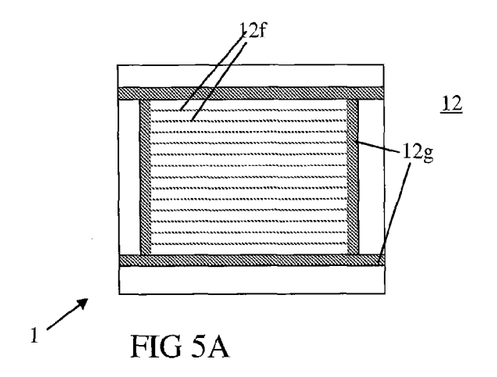
FIG. 5A to 5D shows various alternative topologies for an electrically conductive structure for use in the product according to FIG. 2H.
Figure 5B:
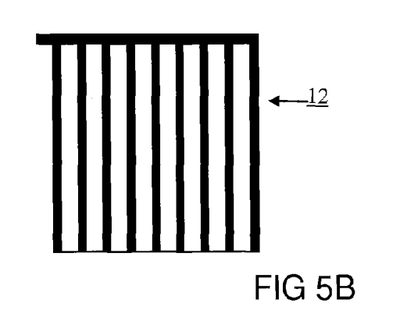
Figure 5C:
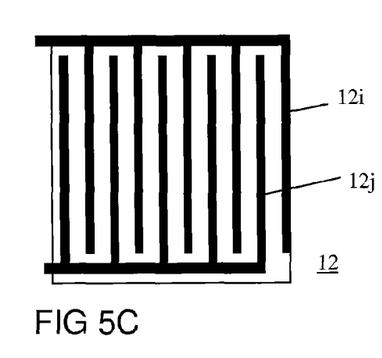

FIGS. 5A-5C show examples of some other topologies of electrically interconnected conductive structures 12. For clarity only the structure 12 is shown.

In FIG. 5A the open, electrically interconnected conductive structure 12 comprises a plurality of elongated elements 12f of a metal that laterally extend over the full width of the device and that are mutually connected by bus-bars 12g of an electrically conducting frame to facilitate an electrical contact with the device 1.

The elongated elements 12f for example have a width in the range of 10 to 100 μm, e.g. 50 μm. The busbars 12g have a width in the range of 1 to 5 mm, for example 1 mm In FIG. 5B, the at least one electrically conductive structure 12 is a comb structure.

FIG. 5C shows a pair of electrically conductive structures 12i, 12j, each in the form of a comb structure, and gripping into each other.

Figure 5D:
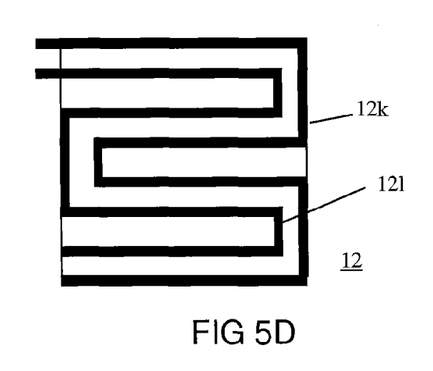

FIG. 5D shows an example wherein a plurality of meandering electrically conductive structures 12k, 12l is arranged. In the example a pair of conductors is shown that may for example each carry a polarity of a power source. However, additional electrically conductive structures may be present, for example to carry control signals.

Figure 6:
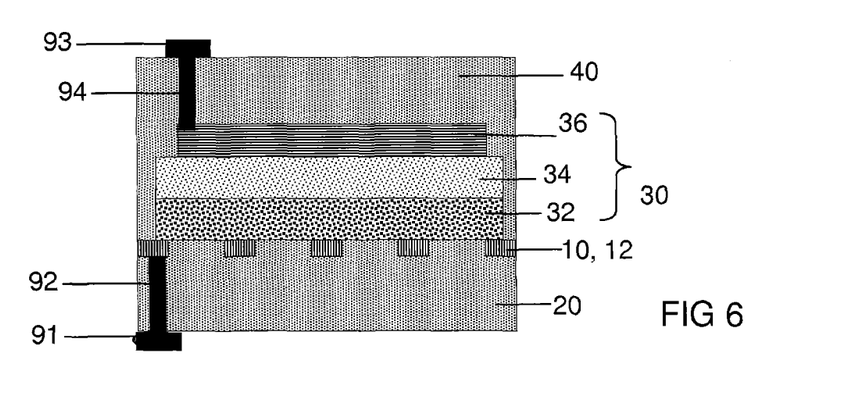
FIG. 6 shows a third embodiment of a thin-film opto-electric device according to the invention.

FIG. 6 shows an example how the device of FIG. 2I may be provided with external electrical contacts. A first external electrical contact 91 is electrically connected via an intermediate conductor 92 to the electrically interconnected conductive structure 12. The intermediate conductor 92 is formed for example by drilling a hole, preferably by laser drilling, in the barrier structure 20, and filling the hole with a conductive adhesive. In an analogous manner an electrical connection 94 may be made between an external contact 93 and the second electrode layer 36.

In the embodiment of FIGS. 5C, 5D, one of the electrically conductive structures e.g. 12i may form the electric supply for the anode and the other 12j may form the electric supply for the cathode. This is schematically shown in FIG. 7. In the embodiment shown one of the electrically conductive structures 12j is covered by an insulating layer 24, so that it does not contact the hole injection layer 32. The insulating layer 24 is applied after step S4 of removing material from the metal substrate 10 at a second main surface 15 and the step S5 of applying a functional structure 30. The insulating layer 24 is for example a photo-resist layer that is patterned in a form conformal to the electrically conductive structure 12j according to a method known as such. After the functional structure 30 is applied it is perforated at locations where the electrically conductive structure 12j is present. Within said perforations 26, transversal electrical conductors 28 may be applied to contact the electrically conductive structure 12j with the other electrode 36. Methods to form the transverse electrical conductors 28 and the ways to insulate them from the active layer structure 30 are described in more detail in the earlier filed European application 08159929.2 (P85193EP00). In this embodiment a connection between external contact 93 and the electrically conductive structure 12j is provided by a transverse electrical connection 94 through the first barrier structure 20. The same applies to other topologies where more than one electrically conductive structure is embedded, such as FIG. 5D having embedded therein the electrically conductive structures 12k, 12l.

It is noted that getter materials may be applied in various parts of the device. For example getter material may be enclosed with the functional structure. Alternatively getter materials may be present in an organic layer of a barrier structure. Various desiccant materials such as molecular sieves (or zeolites), alkaline earth metal oxides, metal oxides, sulfates, chlorides, bromides may be selected as the getter. Zeolites are particularly suitable. Zeolites are materials that absorb moisture by physical absorption and may be naturally or synthetically derived, both are suitable. Natural zeolites are hydrated silicates of aluminum and either sodium or calcium or both, of the type $Na_2O$, $Al_2O_3$, $xH_2O$, and $xSiO_2$. Synthetic zeolites are made either by a gel process or a clay process, which forms a matrix to which the zeolite is added. Well known zeolites include chabazite (also referred to as zeolite D), clinoptilolite, erionite, faujasite (also referred to as zeolite X and zeolite Y), ferrierite, mordenite, zeolite A, and zeolite P. For example, type 3A, 4A and 13X zeolites all have the ability to adsorb water molecules. Such zeolites comprise $Na_2O$, $Al_2O_3$ and $SiO_2$. Certain adsorbent getters can adsorb gaseous contaminants in addition to moisture, such as gaseous $H_2$ and $O_2$.

The opto-electric device may further be provided with a layer provided with scattering particles having a relatively high refractive index in comparison to the relatively low reflective index of the layer to improve light output. Such a layer may be applied for example at a free surface of the device.

By way of example the present invention is in particularly described for a light-emitting diode that is constructed as a thin-film optoelectric device. The present invention is also applicable to a photo-voltaic cell. In that case the functional structure 30 should be replaced by a functional structure, known as such, that provides for a conversion of photon-radiation into an electric current.

The present invention is also applicable to an electrochromic cell. In that case the functional structure 30 should be replaced by a functional structure, known as such, that provides for a voltage dependent transmission of photon-radiation.

In the examples presented above, the embedded electrically conductive structure 12 is the anode. Alternatively, the cathode of the device may be formed by the embedded electrically conductive structure.

In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. Method of manufacturing a thin-film optoelectric device comprising the steps of
    providing a first, metal substrate,
    patterning a first main surface of the metal substrate, therewith creating protruding and recessed portions in said first main surface,
    depositing a first barrier layer structure at the first main surface of the metal substrate,
    removing material from the metal substrate at a second main surface opposite the first main surface, therewith revealing the first barrier layer structure opposite the recessed portions,
    applying a functional structure at a side of the first barrier layer structure where the material from the metal substrate was removed,
    applying a second barrier layer structure, at a side of the functional structure opposite the first barrier layer structure.

2. Method according to claim 1, wherein the step of patterning the first main surface of the metal substrate comprises the substeps of applying a patterned protection layer on said first main surface and etching the metal substrate provided with the patterned protection layer.

3. Method according to claim 1, wherein the step of patterning the first main surface of the metal substrate is carried out by a mechanical process.

4. Method according to claim 1, wherein the step of removing material from the second main surface of the metal substrate is carried out by a homogeneous etching method.

5. Method according to claim 1, wherein the step of removing material from the second main surface of the metal substrate is carried out by a polishing method.

6. Method according to claim 1, wherein a substrate of an organic material is applied at a free surface of the barrier structure before removing material from the second main surface of the metal substrate.

7. Method according to claim 4, wherein the metal substrate comprises a first and a second metal layer that are separated by an etch stop layer, and wherein the etch stop layer is removed after the step of removing material from the metal substrate at the second main surface and before the step of applying the functional structure.

8. Method according to claim 1, wherein after the step of removing material from the second main surface an electrically conductive material is printed according to the pattern defined by the protruding portions that remain within the first barrier layer structure.

* * * * *